United States Patent [19]

Capots

[11] Patent Number: 4,970,648
[45] Date of Patent: Nov. 13, 1990

[54] HIGH PERFORMANCE FLIGHT RECORDER

[75] Inventor: Larry H. Capots, Annandale, Va.

[73] Assignee: Fairchild Space and Defense Corporation, Germantown, Md.

[21] Appl. No.: 373,631

[22] Filed: Jun. 29, 1989

Related U.S. Application Data

[63] Continuation of Ser. No. 84,189, Aug. 12, 1987, abandoned.

[51] Int. Cl.$^5$ .............................................. G06F 11/08
[52] U.S. Cl. .................................. 364/424.06; 360/5; 371/21.2
[58] Field of Search ...................... 360/5; 371/38, 21.3, 371/21.2; 364/424.06, 550, 900

[56] References Cited

U.S. PATENT DOCUMENTS

| | | | |
|---|---|---|---|
| 3,781,824 | 12/1973 | Caiati et al. | 340/172.5 |
| 3,794,831 | 2/1974 | Frankeny et al. | 360/5 |
| 4,258,421 | 3/1981 | Juhasz et al. | 364/424 |
| 4,271,402 | 6/1981 | Kastura et al. | 340/52 F |
| 4,409,670 | 10/1983 | Herndon et al. | 364/900 |
| 4,470,116 | 9/1983 | Ratchford | 364/424 |
| 4,604,748 | 8/1986 | Sato | 371/38 |
| 4,621,335 | 11/1986 | Bluish et al. | 360/5 |
| 4,622,602 | 11/1986 | Kutaragi | 360/48 |
| 4,626,996 | 12/1986 | Arlott | 364/424 |
| 4,646,241 | 2/1987 | Ratchford et al. | 360/5 |
| 4,682,292 | 7/1987 | Bue et al. | 360/5 |
| 4,729,102 | 3/1988 | Miller, Jr. et al. | 364/424 |
| 4,782,486 | 11/1988 | Lipcon et al. | 371/21 |
| 4,817,095 | 3/1989 | Smelser et al. | 371/38 |

Primary Examiner—Kevin J. Teska
Assistant Examiner—S. A. Melnick
Attorney, Agent, or Firm—Michael W. York

[57] ABSTRACT

A recorder for recording and playing back information. The recorder is particularly useful in vehicles such as aircraft and space vehicles. The recorder has no moving parts and has a plurality of power levels. The recorder has the capability of detecting errors in its memory and to avoid using portions of the memory that have errors. The recorder has multiple channels that can be programmed for input or output use. On demand memory assignment capability permits maximum use of the memory array.

5 Claims, 6 Drawing Sheets

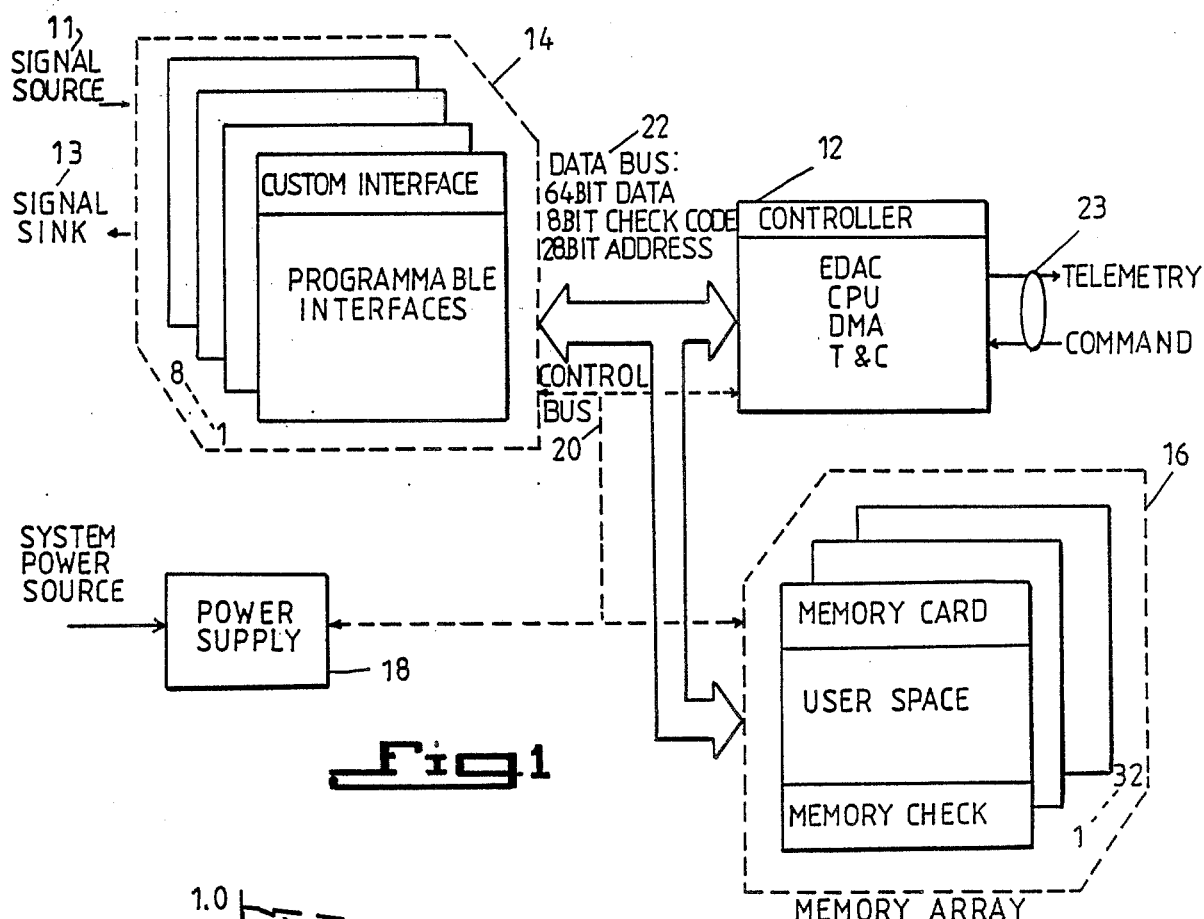
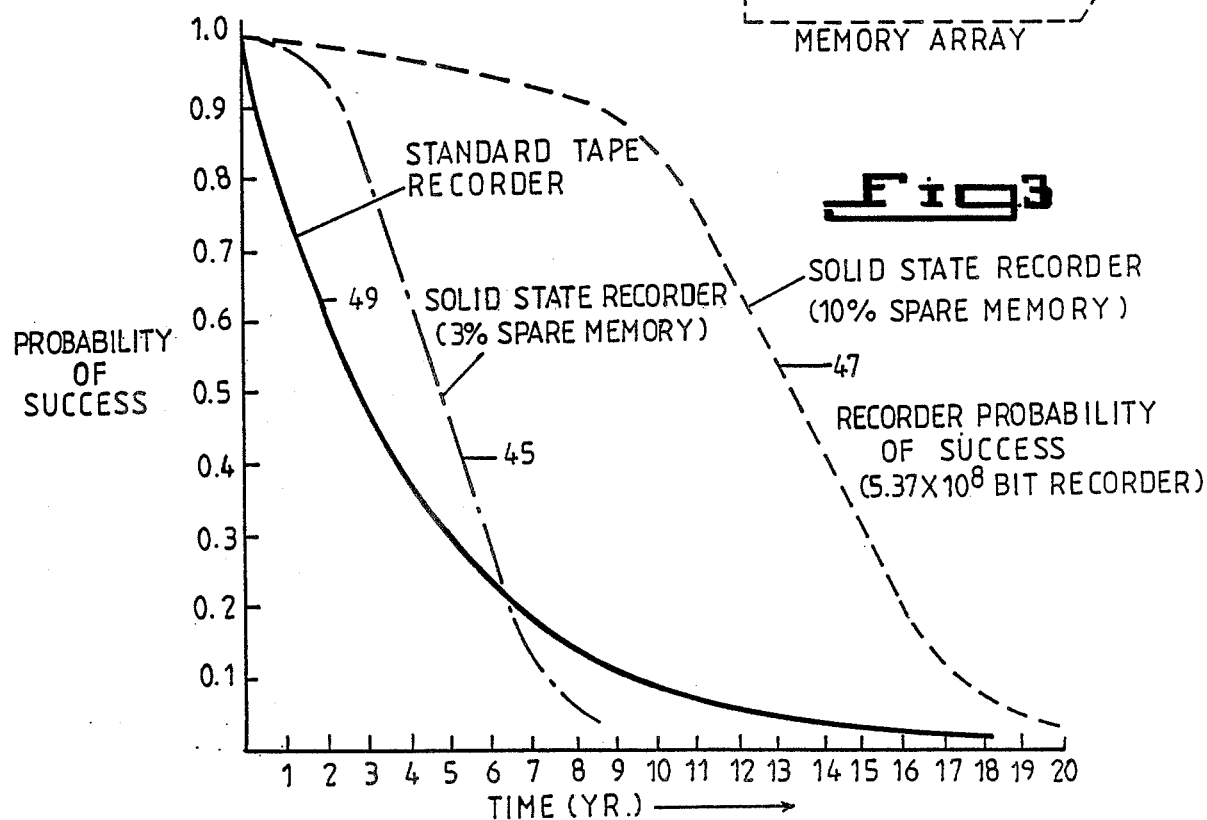

Fig. 8

HIGH PERFORMANCE FLIGHT RECORDER

This application is a continuation of application Ser. No. 07/084,189, filed Aug. 12, 1987 now abandoned.

BACKGROUND OF THE INVENTION

Avionic data systems for both atmospheric and space vehicles routinely use data storage devices in the form of conventional magnetic tape recorders which have been ruggedized for the avionics environment. This approach has placed severe limitations on the data system performance due to poor reliability, slow speed operation, large size, moving mechanical parts resulting in limited life and restricted operational environments requiring additional cost and weight to enable even limited life in operational avionics data systems.

A need for a recorder system compatible with advances in the state-of-the-art of avionic data systems and responsive to the needs of present day mission requirements has been outstanding for nearly twenty years. High speed record/playback, large memory capacities, low power and weight, small size, high reliability, long life and ruggedized performance are highly desireable for vehicles such as aircraft, spacecraft, missiles, ocean vehicles, land vehicle, instrumented projectiles and modern weapons systems test beds. These problems have been eliminated with this invention that has a record/playback unit which eliminates all moving parts by relying on a completely semiconductor unit which is compatible with the environmental constraints of other electronics used for acquiring and processing data.

BRIEF DESCRIPTION OF THE INVENTION

The invention relates to flight recorders and more particularly to flight recorders that have no moving parts.

It is an object of this invention to provide an electronic record and playback unit free from moving mechanical assemblies.

It is an object of the invention to provide a flight recorder that is particularly useful for vehicle applications in space, atmosphere or during transition phase between earth and atmosphere, earth and space, or atmosphere and space.

It is an object of this invention to provide a flight recorder with a densely packaged electronic record/playback unit with the flexibility to increase memory capacity and to be compatible with industry standard data, voice and video signal modulation types and to provide a standard internal bus for custom interface requirements.

It is an object of this invention to provide a flight recorder with a record/playback unit which autonomously adjusts for environmental effects of radiation, random errors due to component aging and workmanship defects to permit long unattended operational life.

It is an object of this invention to provide a flight recorder with a programmability in operational mode to permit selection of input and output channel(s), output channel rates, record, playback, simultaneous record and playback, or standby modes.

It is an object of this invention to provide a flight recorder with the capability for optional battery back-up operation to permit non-volatility of recorded information.

It is an object of this invention to provide a flight recorder with compatibility for plural forms of semiconductor memory technologies that permits addressabililty and parallel operation.

It is a further object of this invention to provide a flight recorder with data error correction.

It is also an object of this invention to provide a flight recorder with instantaneous response for all input sources within a record mode bandwidth of 0 bits per second up to 160 Megabits per second and provide an output bandwidth of 0 bits per second up to 140 Megabits per second.

BRIEF DESCRIPTION OF DRAWINGS

The invention will be hereinafter more fully described with reference to the accompanying drawings in which:

FIG. 1 is a block diagram of the high performance flight recorder of the present invention;

FIG. 3 is a graph illustrating the survivial probability of the invention;

FIG. 8 is a block diagram of the firmware which provides the control and operation of the invention set forth in FIG. 1.

DETAIL DESCRIPTION OF THE PREFERRED EMBODIMENT

Figure 2:
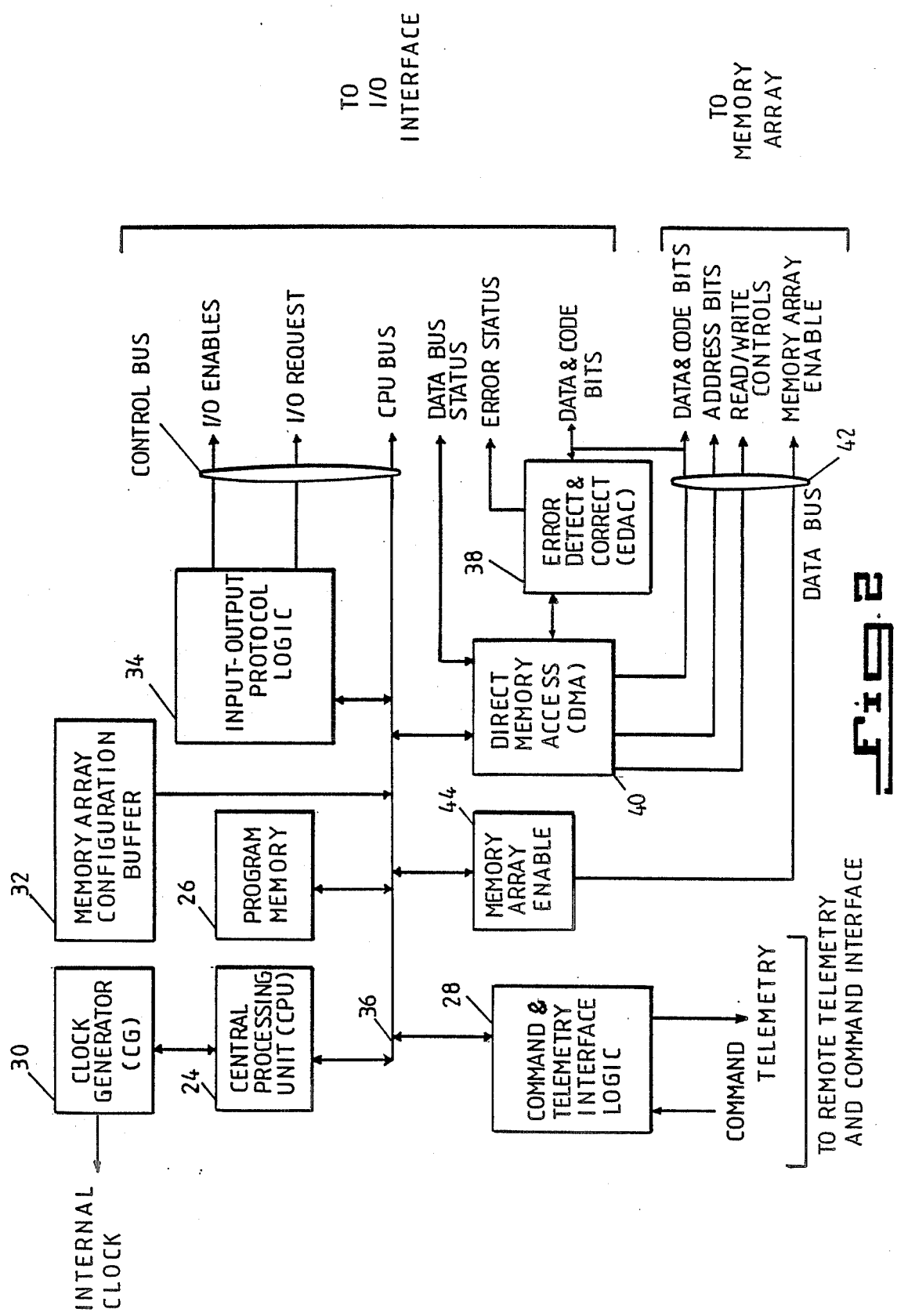
FIG. 2 is a block diagram of a portion of the invention set forth in FIG. 1.

A functional block diagram of the invention is illustrated in FIG. 1. The basic elements of the flight recorder 10 comprises the controller means 12, the input/output means 14, the memory means 16, and the power supply 18. The controller means 12 provides basic timing information and status and control signals required by the input/output means 14 and the memory 16. Distribution of this information is by the control bus 20 which also provides the power distribution and interconnects the controller 12, the custom interface means 14, and the memory 16 and the power supply 18. The data system command and status monitor interfaces, element 23, are processed by the controller 12. An independent data bus 22 interconnects portions of the controller 12 with the input/output means 14 and the memory 16. This bus 22 moves data between memory and the input/output interface. Buses 20 and 22 are responsible for providing the large operating bandwidth (160 Mbps) for the recorder 10 and its expandability. Since these buses 20 and 22 are well defined in terms of singal level, timing and protocol, memory expansion in terms of capacity or change in technology is easily accommodated by providing the necessary bus interface circuitry. Similarly the custom interface means 14 channel expansion capability can easily be accommodated to handle multiple channels and custom input/output requirements by providing the necessary bus interface circuitry to connect with buses 20 and 22.

The controller 12 is illustrated in detail in FIG. 2. A central processing unit (CPU) element 24 combined with program memory element 26 provide the basic support circuitry for the flight recorder 10. The operation of the flight recorder 10 is determined by the program stored in the memory element 26. The program memory 26 comprises both fixed memory for firmware programs and alterable memory for software programs which work in combination with the CPU 24 to provide the intelligence for operating flight recorder 10 remotely. The command and telemetry (C&T) interface element 28 provides flight recorder 10 with the external access for remotely entering commands and extracting telemetry related to the operational modes of the unit. Clock generator element 30 provides the necessary clock function required by elements in the controller 12 and other circuits internal to the recorder 10. The memory array configuration buffer element 32 provides hardware programmability of the controller 12 to permit flexibility in configuration of the memory 16. Message passing between the controller 12 and the input/output means 14 function is supported by the program stored in the program memory element 26 and the circuitry contained in the input/output (I/O) protocol logic element 34. The input/output protocol logic element 34 permits expansion to eight independent custom input/output interfaces. This communication interface permits command and status information to be exchanged with an input/output function. The I/O section 34 can be itself programmable with its own CPU 24 or very basic so as to respond to simple control signals. The control bus is generated in the controller 12 which acts as the master of this bus. Requests for service from an I/O function 34 are prioritized by the controller 12 which then grants the request, performs whatever service is appropriate via the CPU bus 36, and then suspends communications. Data to be stored in the recorder 10 are provided to the controller 12 by the I/O interface. These data are error encoded in the error detection and correction (EDAC) element 38 which appends a check code word to the data bits. Both data and check code words are stored in memory array 16.

The direct memory access (DMA) element 40 generates address information for storing the data and check code, then provides the necessary interface signals and timing information to store these data. This operation repeats continuously until no further data are available or preassigned memory array space has been filled. In the retrieve or playback cycle, an I/O interface (one of eight custom interfaces of element 14) requests data from the controller 12 which then sets up the DMA 40 and EDAC 38 to retrieve and correct, if necessary, data which are stored in the memory array 16. The DMA 40 provides address timing signals to start the EDAC 38 and move data to the data bus 42. The EDAC 38 informs the I/O protocol logic 34 that data are available. All transactions on the data bus 42 are time synchronous and multiplexed (time division multiplexed) so that read and write operations can occur in any order without collision. As a result, the recorder 10 can record and playback data simultaneously. The data are not serviced by the CPU element 24. As a result, the data bus 42 speed is dependent upon the DMA 40, EDAC 38, memory array 16 and physical length of the data bus 42. The memory array enable element 44 provides expansion of the data bus to a maximum of thirty-two individual memory array 16 elements.

Unlike the conventional tape recorder, recorder 10 has multiple modes of operation which can satisfy a number of data handling requirements. The recorder 10 has multiple modes by virtue of the flexible hardware implementation of the controller 12 functions which is complemented by software (or firmware) provided in the program memory 16. The software supports several modes of operation:

Record/Playback (multiple channel I/O)
Multiplexer (multiple inputs, single output)
First In First Out (FIFO) Buffer
Built-in-Test (BIT)
Mixed Modes The Record/Playback mode mimicks the conventional tape recorder operation with the enhancements of 160 megabits per second input bandwidth, 140 megabits per second output bandwidth and a combined simultaneous record and playback bandwidth of 140 to 160 megabits per second. Commands for start, stop, rewind, channel select and playback rate are provided via the remote command and telemetry interface element 28 (FIG. 2).

In the Multiplexer mode, multiple input data sources can be combined to a single channel output. This feature is a result of the programmability of each I/O interface 14 by the controller 12 and the flexible partitioning of memory array 16 space which is done on an as need basis such that high rate data sources dynamically acquire larger portions of memory compared to lower rate sources without any apriori partitioning of the memory array 16. Commanding is provided via the command and telemetry interface 28 to select the input channels, output channel, output rate and channel configuration. In the FIFO mode an input channel and output channel pair are selected and the recorder 10 automatically maintains a continuous flow of data from input to output with either a floating buffer size or a fixed buffer size to implement a programmable delay function.

The Built-in-Test (BIT) mode is exercised at initial turn on to determine available (error free) memory space in the memory array 16 by executing write/read operations with known data patterns stored in program memory element 26 of FIG. 2. The program memory, element 26, keeps a list of good memory page addresses for data storage. Memory pages are the smallest portion of the memory array 16 which has meaning to the CPU 24. This page size is programmable so that it can be programmed to match physical memory boundaries in the memory array 16. The DMA 40 provides addressing at the sub-page level. Periodically the firmware exercises the BIT to evaluate memory array 16 pages for non-correctable errors. Memory pages so identified are removed from the list of good memory pages.

As a result of this implementation, the survival probability of the recorder 10 far exceeds conventional electromechanical recorders. This is illustrated in FIG. 3 where survival probability enhancement is illustrated for two cases of 3%, element 45, and 10%, element 47, spare memory with permanent single bit error tolerance provided by the EDAC, element 38 in FIG. 2. Element 49 is the classical survival probability of conventional mechanical recorders. In the mixed mode of operation, within channel and bandwidth limitations, any of the previous modes can operate concurrently. The modes of operation are selected by commands via the command and telemetry interface 28. In all modes of operation, the internal status of I/O 14, memory array 16, controller 12 and power supply 18 is available as telemetry 28 (FIG. 2). Telemetry data tables are stored in the program memory element 26 (FIG. 2) and are therefore programmable to accommodate specific application requirements.

Figure 4:
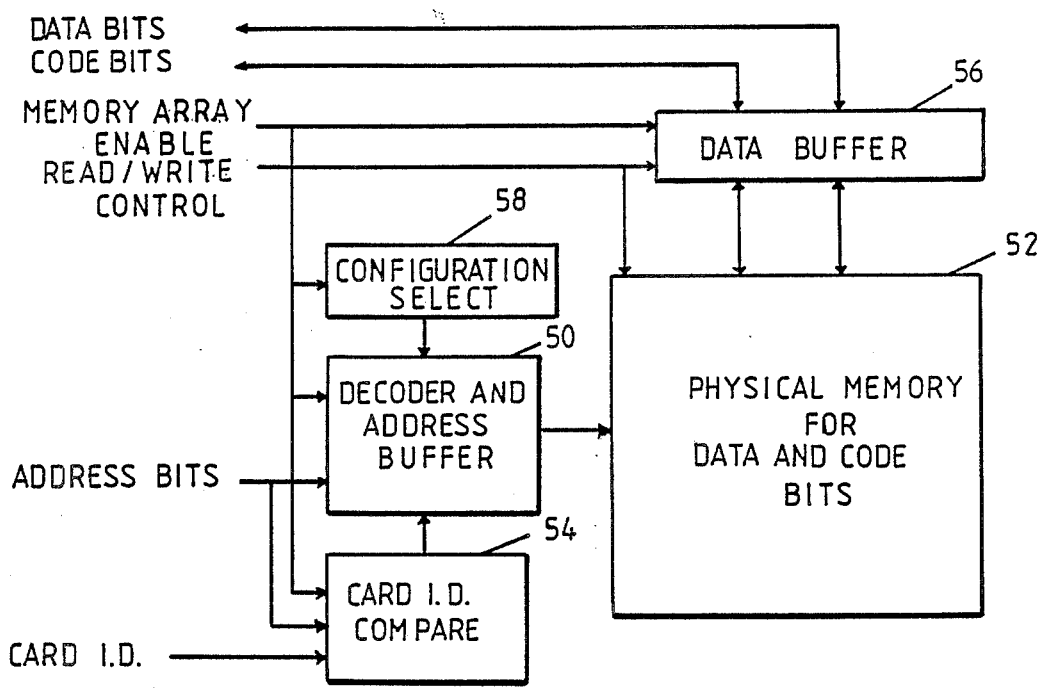
FIG. 4 is a block diagram of a portion of the structure set forth in FIG. 2.

The memory array 16 functional block diagram is illustrated in FIG. 4, which represents one of a maximum of thirty-two array elements that can be addressed on the data bus 42. Data and code bits can be present at any time. The controller 12, via the CPU 24, uses one of thirty-two memory array 16 enables to select the proper array for storing or retrieving data. The DMA 40 provides the address bits and read/write timing control so that the decoder and address buffer element 50 can latch the address for the physical memory element 52. Element 54 contains circuitry which is used to verify that the proper memory array of the 32 possible arrays was appropriately addressed. When data are to be stored, the data buffer element 56 latches the data and transfers it to the physical memory 52 under DMA 40 control. The DMA 40 also controls the read cycle timing to move data from the physical memory 52 to the data buffer 56. The configuration select element 58 allows for programability of the memory array 16 so that the physical memory 52 can be implemented in a number of standard configurations.

Figure 5:
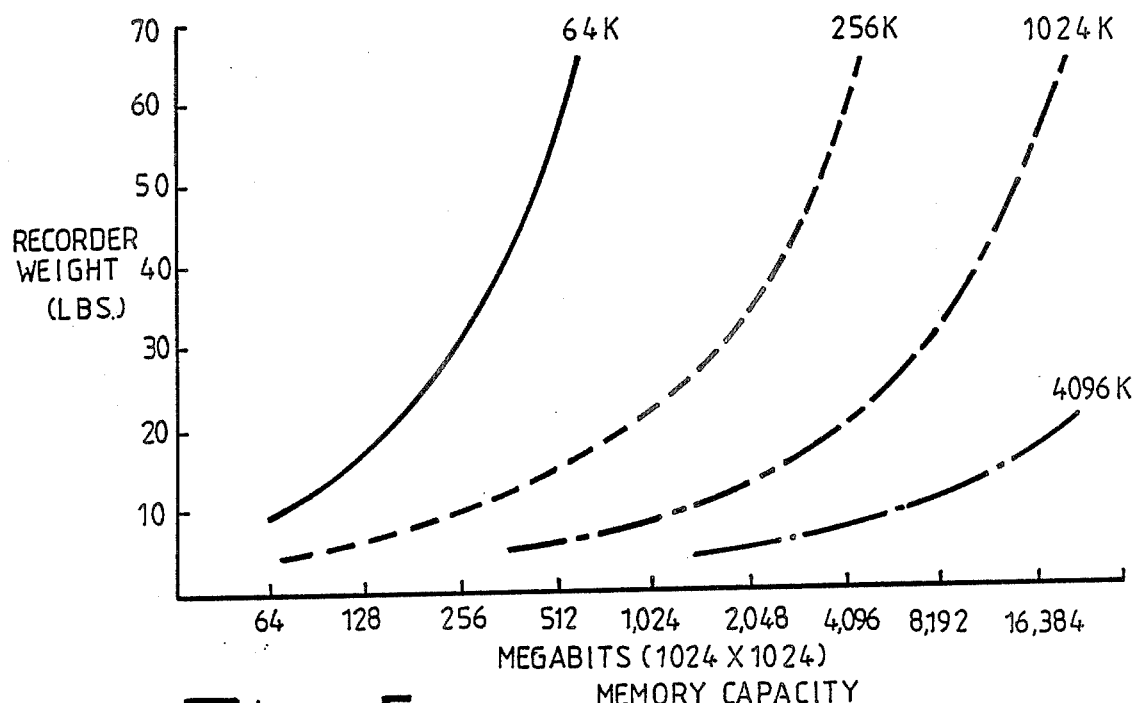
FIG. 5 is a graph illustrating the weight of the invention versus memory.

Until very recently, semiconductor memories were not available in sufficient densities to make the recorder 10 a practical invention. Memory devices are now available as fully monolithic memories as 64 Kbit, 256 Kbit and 1,024 Kbit (K=1,024) with development in process for 4,096 Kbit devices. In order to provide an advantage over the present state-of-the-art in recorders in terms of size, weight, power, and speed, the memory array 16 is implemented in static complementary metal oxide semiconductor (CMOS) technology. A purpose of the invention is to provide an architecture within which advanced solid state memory technologies can be easily inserted so that a rapid transition can occur between the laboratory and the market place. The memory array 16 in the preferred embodiment is fabricated using surface mount packaging technologies known in the art. The size and weight of the recorder 10 are dependent upon total storage capacity and the memory technology selected for the memory array 16. In FIG. 5, four densities of monolithic semiconductor memories were used to illustrate the size and weight progression of the recorder 10 from a minimum of 64 Megabits to a maximum of 16,384 Megabits capacity.

Figure 6:
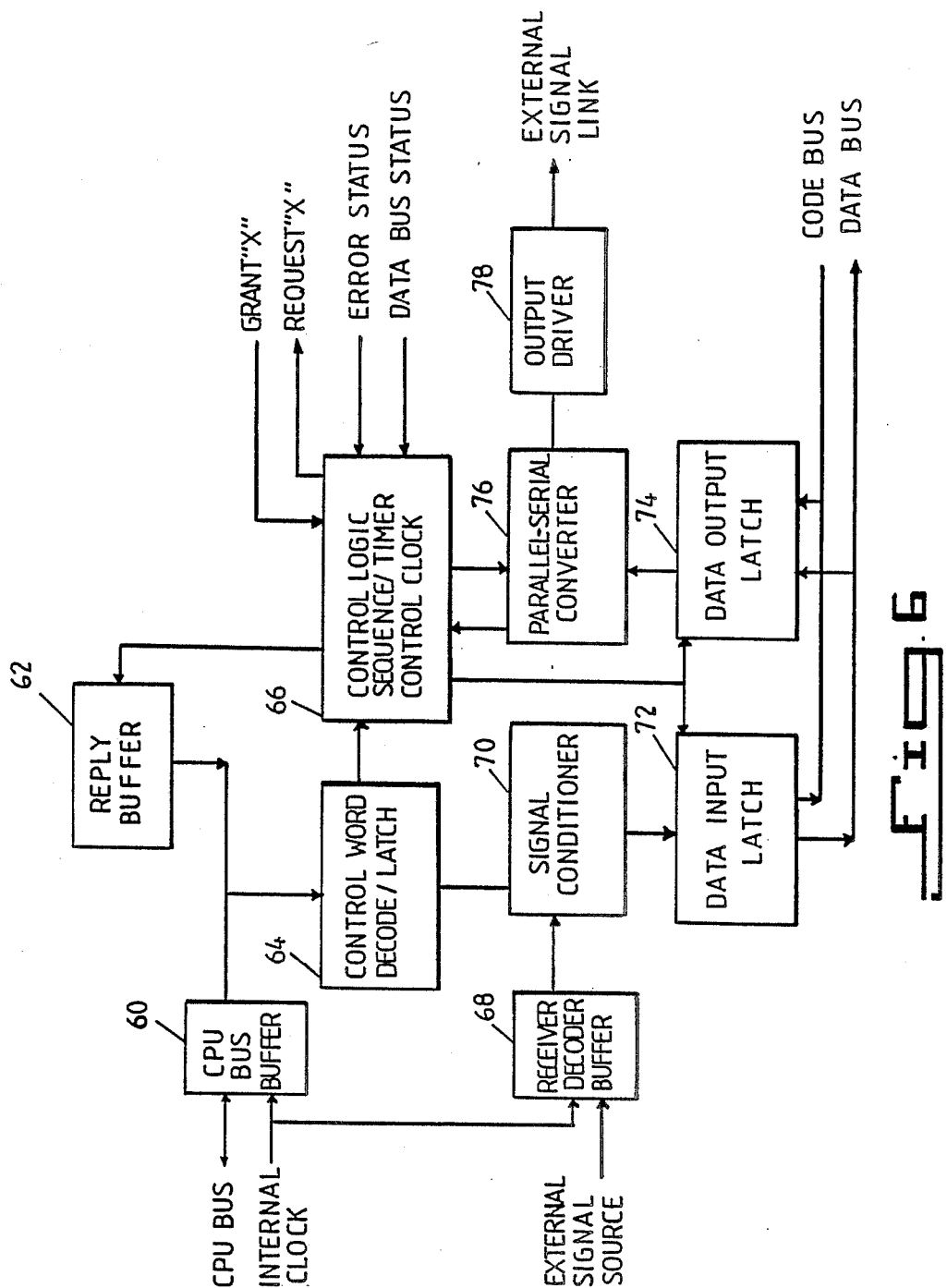
FIG. 6 is a block diagram of the input and the output circuit associated with the flight recorder invention set forth in FIG. 1.

An input/output (I/O) functional block diagram for the recorder 10 is set forth in FIG. 6. The adaptability of this invention to satisfy a broad spectrum of requirements for end users is a result of the flexibility in the architecture to accept as many as eight custom interfaces which handle the data input and output protocols. The communications interface with the controller 12 comprises the CPU bus buffer 60, the reply buffer 62, the control word decoder/latch 64 and the control logic sequencer/timer 66. Control words are passed to the I/O section 60 via the CPU bus 36. The control word decode/latch 64 latches and decodes the word for the control logic element 66. Eight bit control words are formatted to indicate functions such as:

| | |
|---|---|
| output rate select | channel selection |
| on/off | output code bits |
| reset | input data format |
| output data format | self-test on/off |
| select I/O protocol | |

The reply buffer 62 provides status information which can be accessed by the controller 12 and CPU 24. The recorder 10 interface with the external signal source is via the receiver decoder 68 which contains the hardware necessary to detect the incoming signal and any associated clock or enable signals which might be unique to the signal source. The input data are synchronized with the internal clock so that asynchronous data sources will not downgrade the recorder 10 performance. If the input signal is digital, the signal conditioner element 70 converts it to NRZ-L protocol then forms a 64 bit parallel word which is latched by the data input latch element 72. If the data are analog, then the signal conditioner element 70 provides the analog to digital conversion processing necessary to produce digital output. Once data are latched, the controller is issued a request for data storage by the control logic sequencer/timer 66.

For the playback operation an additional latch, the data output latch 74, captures data from the data bus 42 to form the recorder 10 output signal. The implementation of a double latch, element 72 for input and 74 for output, provides the capability for the simultaneous record and playback mode of operation. A parallel to serial converter 76 provides a continuous stream of serial digital data to the output driver 78 which conditions the signal for output from the recorder 10. The parallel to signal converter 76 also informs the control logic sequencer/timer 66 when the current 64 bits of data are being outputted so that a request can be issued to the controller 12 for the next 64 bits of stored data. This request is serviced by the controller DMA 40 so that data transfers can occur at hardware speeds. The EDAC informs the I/O section 34 of the error status when data are read from the memory 16. The status information provided by EDAC 38 indicates if a single or multiple error was detected and when in time the data correction cycle is complete so that data may be taken for output either after correction or prior to it. This feature is particularly useful in the built-in test.

Figure 7:
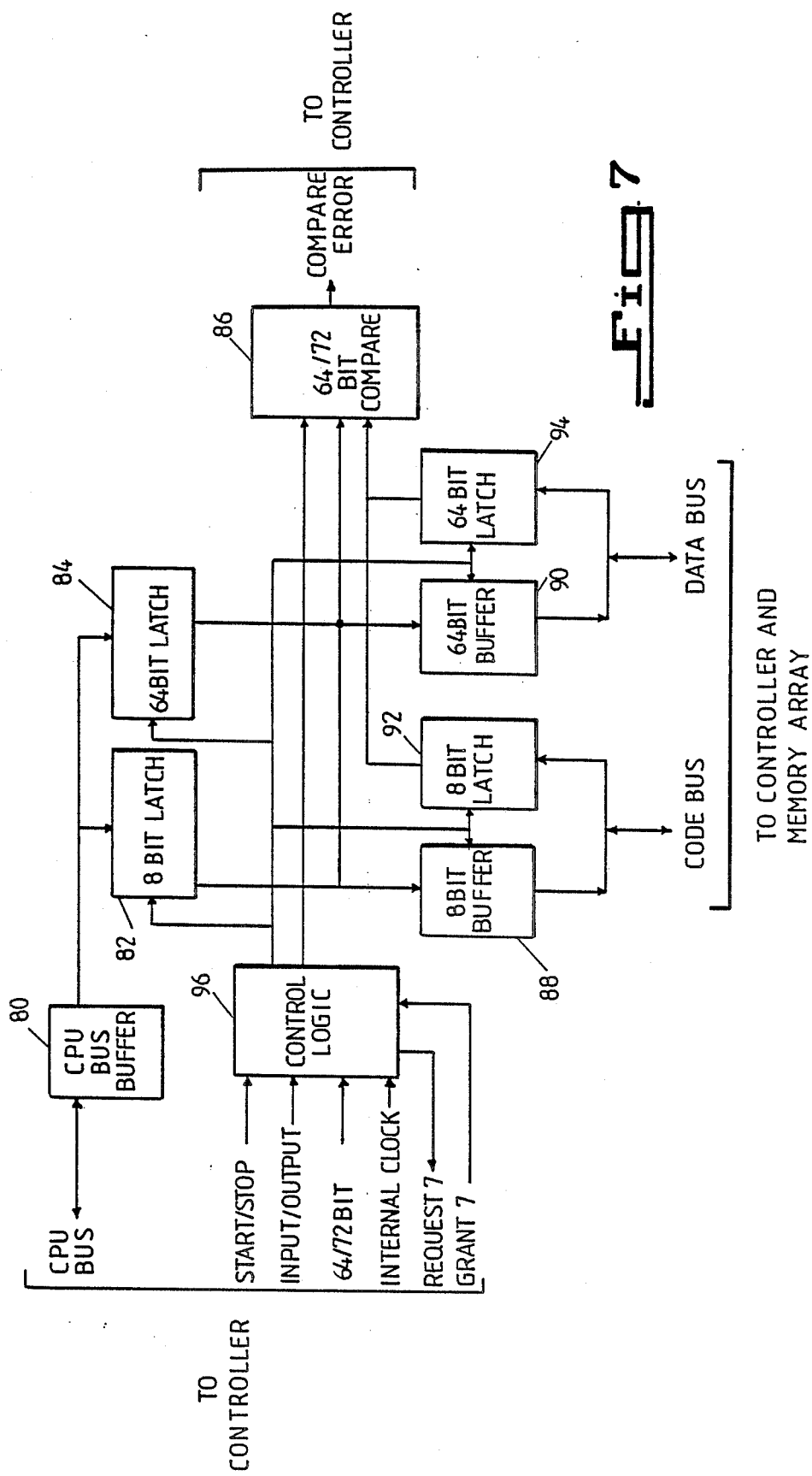
FIG. 7 is a block diagram of the built in test circuit associated with the invention set forth in FIG. 1.

The built-in test (BIT) implementation is illustrated in the block diagram of FIG. 7. In this case, the external signal source and sink (see elements 11 and 13, FIG. 1) are replaced by the controller CPU 24 and program memory 16, which contains fixed data patterns for memory test purposes. In FIG. 7, Grant "X" and Request "X" have arbitrarily been assigned X=7. Access to the CPU bus, 36, is provided by the CPU bus buffer logic element 80. In this example latches 82 and 84 get data from the controller 12 which are sent to comparator element 86 and buffers 88 and 90. These data are then stored in the memory arrays 16 and read back. The retrieved data are latched in latch elements 92 and 94 for the comparator 86 to evaluate. The compare error status is available to the controller CPU 24. In this way, known test patterns of data can be cycled throughout all of memory array 16 to determine good/failed memory elements so that the controller 12 can update the good memory page list. The control logic element 96 provides programability so that full 72 bit wide or just 64 bit wide compares can be made to permit independent testing of both the data storage and code storage sections of memory array element 16.

The power converter support element for the recorder 10 is required to provide stable dc voltage to the recorder 10 electronics. The form of the converter will be dependent upon the primary power source available, for example either dc or ac at 60 Hz, 50 Hz or 200 Hz.

In the event of loss of power, the recorder 10 data stored in memory 16 may be lost depending upon the memory technology used. In the event a volatile memory is used, the power converter will be capable of backup support using standard energy cells such as primary or secondary battery chemistries or solar.

The firmware support elements for recorder 10 is the intelligence which manages the operation of the controller 12 element. The firmware is an interrupt driven architecture with thirteen primary modules, shown in FIG. 8 which utilize the twenty-four subroutines and two data modules listed in Table I.

TABLE I

| SUPPORT SUBROUTINES | | DATA MODULES |
|---|---|---|
| CONF | QPTCLM | BITT - BUILT-IN-TEST |
| DEQFR | QUFR | DATA FORMATS |
| DQPFCL | SCB | TLMTBL- TELEMETRY |
| FLUSHGCB | SETDO | FORMAT |
| GMASK | SMEB | |
| ICCCLR | SPCHI | |
| ICCSET | SPCHO | |
| INBD | SRCHI | |
| IOCCLD | SRCHO | |
| OFCHCD | | |
| OFCHDM | | |
| ONCHCD | | |
| ONCHDM | | |
| PTPL | | |
| QPTCLM | | |

A hardwired master interrupt is used to detect the power on condition and start the firmware execution with module MSTRST element 98 which copies firmware from the PROM portion of element 26 (FIG. 2) into the RAM portion for execution and enables interrupts for subsequent program execution. The first time power is turned on, execution goes into the SSRINI element 100, executes a test of memory array element 16 address and data lines, does a simple data pattern test on element 16 then executes BIT element 102. BIT is used here to do a fixed pattern test on memory array 16 to determine good (useable) and bad (not to be used) pages of element 16 and to do a functional test of EDAC element 38. This function in BIT 102 is then bypassed on subsequent entries into this module.

Execution then enters the basic program module element 104 called I4MS. This element 104 is a basic 4 msec routine which is hardware interrupted to execute one of 6 modules (see FIG. 8). Element 106 is a new page (NP) module which selects the next available page in memory array element 16 for either data input or data output, provides the information for hardware DMA element 40 to execute the appropriate data transfer and sets up pointers to identify operational mode of the input/output channels of element 14. Element 108 is the end of process (EOP) module which recognizes the last data transfer (input or output) to memory array element 16 and then saves pointer and page status information for the terminated channel. Element 110 is the serial command module which interprets the data bits of the serial command received by element 28, FIG. 2. These commands configure the recorder 10, an example of the types of commands which can be interpreted are given in Table II.

TABLE II

SSR Serial Magnitude Command Formats

| Type code | Bit Format (5432109876543210) | Function |
|---|---|---|
| 00H | 0000xxxxxxxxxxxx | SPARE |
| 01H | 0001xxxxxxxxeccc | Enable/Disable I/O Channel Interface<br>ccc = Channel #(0-7)<br>e = enable 1<br>disable 0 |
| 02H | 0010qqqqqqqqqccc | Set Page Quota<br>ccc = Channel #(0-7)<br>qqqqqqqqq = Page Quota (0-511) |
| 03H | 0011xwwwxxxxxccc | Select I/O Channel Interface control word for subsequent load<br>ccc = Channel #(0-7)<br>wwww = control word #(0-7) |
| 04H | 0100xddddddddccc | Load I/O Channel Interface control word<br>ccc = Channel #(1-7)<br>dddddddd = data |
| 05H | 0101xxttrsnnnmmm | Associate Channels n and m (input and output) to ss mode<br>s = 0 FIFO tt = 0-1<br>1 TR tt = 0-3<br>r = 0 Set<br>1 Reset<br>nnn = Input Channel #(0-7)<br>mmm = Output Channel #(0-7)<br>r = 0 Set Association<br>= 1 Reset Assocociation |
| 06H | 0110xxxxdsseiccc | Start/Stop ss [Input/Output]<br>ss = 00 Channel ccc = 0-7<br>01 Spare<br>10 TR ccc = 0-3<br>11 FIFO ccc = 0-1<br>i = Input 0<br>Output 1<br>d = 64-bit output 0<br>72-bit output 1<br>e = Stop 0<br>Start 1 |
| 07H | 0111xxxxxxxssccc | Reset Data Pointer<br>ss = 00 Channel ccc = 0-7<br>01 Spare<br>10 TR ccc = 0-3<br>11 Spare |
| 08H | 1000xxxxssnnnmmm | Copy Channel/Buffer n data to Channel/Buffer m<br>ss = 00 Channel n to Buffer m<br>= 01 Channel n to Channel m<br>= 10 Buffer n to Channel m<br>= 11 Buffer n to Buffer m<br>nnn = Channel/Buffer #(0-7)<br>mmm = Channel/Buffer #(0-7) |
| 09H | 1001xxxxxxxxxxxx | SPARE |
| 0AH | 1010xxxxxxxxxxxx | SPARE |
| 0BH | 1011xxxxxxxssccc | Delete Data Channel/Buffer/TR<br>ss = 00 Channel ccc = (0-7)<br>= 01 Buffer ccc = (0-7)<br>= 10 TR ccc = (0-3)<br>= 11 Spare |
| 0CH | 1100xxxwabcdefgh | General Control<br>w = 1 enable<br>0 disable<br>a = Bad Page list<br>b = EDAC<br>c = B.I.T. memory test<br>d = EDAC test (one shot)<br>e = Single bit error page usage<br>f = Reset Load errors<br>g-h = Spare |
| 0DH | 1101pcccdddddddd | Memory Load<br>p = parity (odd) for bits 0-7<br>ccc = Load subfield type ID<br>= 001 Load address LSB<br>= 010 Load address MSB |

TABLE II-continued

SSR Serial Magnitude Command Formats

| Type code | Bit Format | Function |
|---|---|---|
| | | = 011 Load count (0-255) |
| | | = 100 Data |
| | | dddddddd = data field for ccc types |
| 0EH | 1110xxxxxxxxxxxx | SPARE |
| 0FH | 1111xxxxxxxxxxxx | SPARE |

Element 112 is the telemetry (TLM) output module which provides telemetry in the form of 8 bit digital bytes. These data are stored in data module TLM BTL of Table I. When element 28 requests these data for output, element 112 transfers the data sequences to element 28 which then serializes these bits for output from the recorder 10. Telemetry is an important function for remote operation. Table III provides an example of the kinds of status information provided by these data.

TABLE III

Sample of 8 bit
Serial Digital Telemetry
*Typical Telemetry List for Tape Recorder Mode
Channels O Input and Channel I Output
(Expandable to 8 channels)

| | |
|---|---|
| SSR Status Word | (1 BYTE) |
| Bad Page Count | (2 BYTES) |
| Single Bit Error Count | (1 BYTE) |
| Free Page Count | (2 BYTES) |
| Channel O Status Word | (1 BYTE) |
| Channel O Page Count | (2 BYTES) |
| Channel I Status Word | (1 BYTE) |
| Channel I Page Count | (2 BYTES) |
| Channel I Output Page Count | (2 BYTES) |

As the command and telemetry are interpreted and generated in the firmware portion of the recorder 10, they can be tailored to satisfy requirements specific to the user's application. Element 114 is the module used to flushout good and bad memory pages from element 16 and is called FLPAG. FLPAG looks at memory pages which have been used by the I/O channels of element 14 and determines the error status and establishes a list of good pages for subsequent data storage and bad pages which will not be used unless BIT, element 102 can determined that they are error free. BIT element 102 uses patterns stored in data module BIT of Table I to perform a series of rigorous tests on the unused portions of memory array element 16. These data patterns are selected to test for bad memory bits, failed devices, proper functioning of EDAC element 38, classify errors as single or multiple bit word (72 bits) errors and keep a record of error status in data module TLMTBL of Table I.

Figure 8:
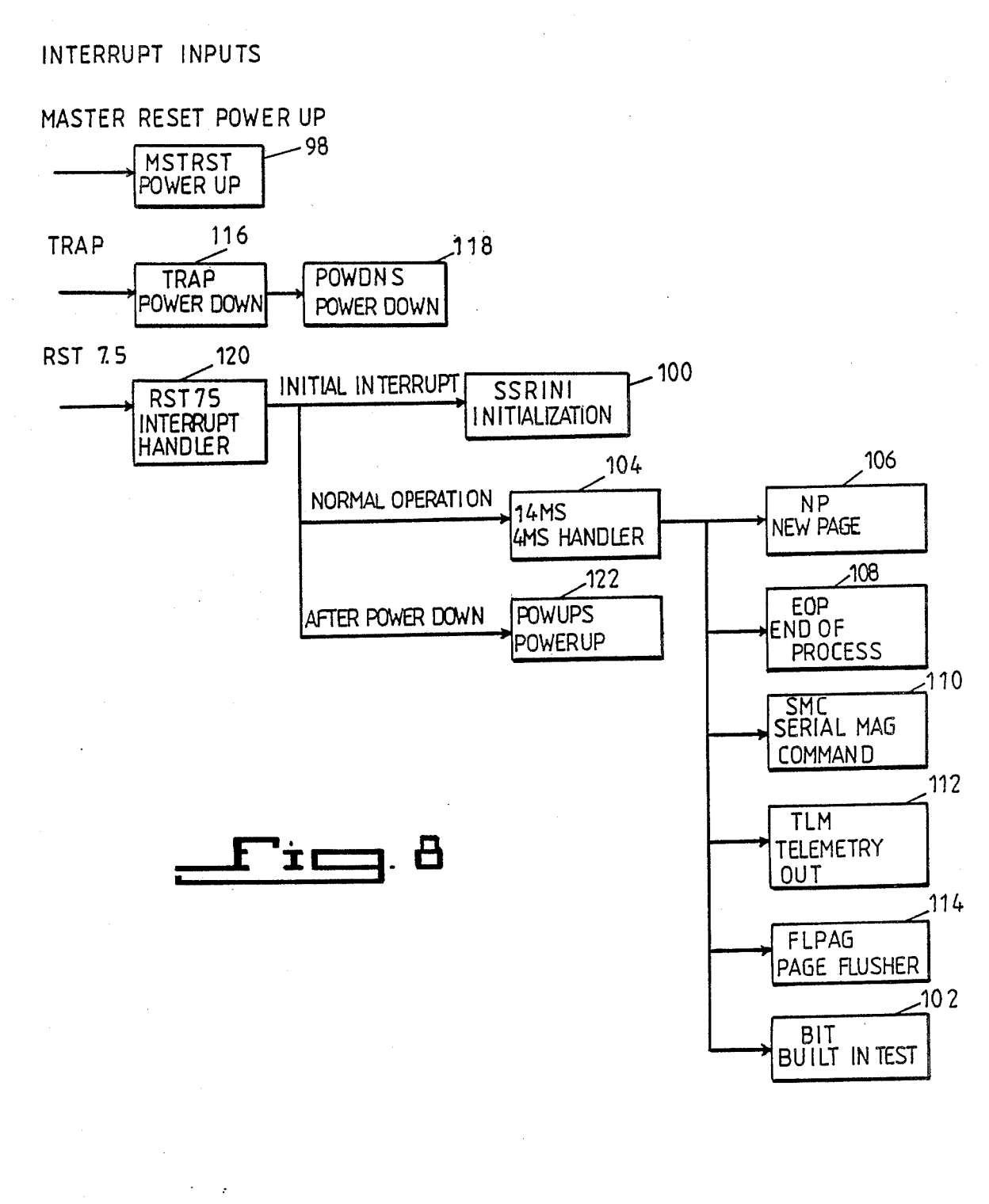

When power is turned off to the recorder 10 and then reapplied, the recorder 10 responds as described above. If a battery option is used to provide back-up power for retention of data stored in memory array 16, the power down sequence control is routed through module TRAP, element 116, where status information is latched so that an orderly recovery can occur when full power is restored. Module POWDNS element 118 sets appropriate flags for the program so that upon restoring power, hardware interrupt signal RST 7.5 in FIG. 8 is recognized. Module RST75 element 120 detects the power on condition via interrupt signal RST 7.5 and uses the flags set up in POWDNS element 118 to bypass element 100 and begin execution in POWUPS, element 122. POWUPS 122 uses the status information latched by element 116 to re-establish configuration and mode of operation of the recorder 10 so that normal operation can be resumed without going through element 100 which would create an initial power-on configuration and thereby cause loss of stored data in memory array 16.

The recorder 10 is made and used in the following manner. The elements which comprise the recorder are a combination of microcircuits and electronic components well known to those skilled in the art of electronics design. The I/O 14 is comprised of digital integrated circuits of the basic transistor-transitor logic (TTL) family varying in complexities from small scale integration (SSI) to medium scale integration (MSI) and the emitter-collector logic (ECL) family. Analog integrated circuits are used for signal switching, conditioning and conversion, of analog signals to digital form for data storage in the memory array 16 and for converting stored digital data retrieved from memory 16 for analog output from element 14. A typical parts description for element 14 is given in Table IV.

TABLE IV

Parts Description I/O Element 14

| | |
|---|---|
| CMOS Quad Nand | ECL Buffer, 100K Series |
| CMOS Quad NOR | ECL Driver, 100K Series |
| CMOS Hex Inverter | ECL Level Translator, 100K |
| CMOS Quad AND | Series |
| CMOS Quad OR | Bipolar Line Receiver |
| CMOS Dual J-K Flip Flop | Bipolar Line Driver |
| CMOS Decoder | |
| CMOS 4 Bit Counter | |
| CMOS Shift Register | Miscellaneous Parts: |
| CMOS Octal D Flip Flop | |
| CMOS 8 bit Comparitor | Capacitor: 2200 pF, 47 pF |
| CMOS Dual Multiplexer | Resistors: 10K, 169, 84.5 |
| CMOS Analog to Digital Converter, 20 MHz | Connector: 184 pin |
| CMOS Digital to Analog Converter, 20 MHz | |

The controller 12 is also comprised of microcircuits known to those skilled in the art of electronics design. Components used are similar to those in element 14, however excluding the use of ECL and analog microcircuits. The complexity of logic is large scale integration (LSI) and semi-custom LSI. Design practices and components known to the industry for developing microcomputers are used here. Table V is a description of the parts used in element 12 for the preferred embodiment.

TABLE V

Parts Description Controller Element 12

| | |
|---|---|
| CMOS 8 bit Microprocessor | CMOS Octal Latch |
| CMOS 16K bit × 1 RAM | CMOS 8 bit Comparitor |
| CMOS 32 bit Error Detection and Correction | CMOS 8 bit Shift Register |
| | CMOS DMACC Custom Gate Array |
| CMOS Octal Latch | Bipolar 8K bit × 8 PROM |
| CMOS Octal Buffer | Bipolar 40 MHz Oscillator |
| CMOS Decoder | Bipolar Quad Comparitor |
| CMOS Octal D Flip Flop | Bipolar Dual Nand |
| CMOS Quad Nand | Bipolar Hex Inverter |
| CMOS Quad Nor | |
| CMOS Hex Inverter | Miscellaneous Parts: |
| CMOS Triple Nand | Bipolar Transistors: PNP Switch |
| CMOS Dual J-K Flip Flop | Capacitors: 4700 pF |
| CMOS Quad Or | Resistors: 5K, 5.1K, 1K |
| CMOS Quad And | Connectors: 184 pin |

The memory array element 16 is comprised of a plurality of similar assemblies. Each assembly is comprised of a large number of memory microcircuits which are connected to each other both in parallel and series fashion to form addressable pages of physical memory which are 72 bits in width and variable depth. Logic circuits familiar to those skilled in the art are used for address decoding and for buffering address and data lines. Table VI provides a description of the parts used in the preferred embodiment. The electronics packages for each microcircuit is surface mountable and as such the printed circuit board material needs to be thermally stable with respect to the mircocircuit thermal expansion and contraction. Although many printed circuit materials are acceptable, the preferred embodiment utilizes an Epoxy-Kevlar printed circuit material.

TABLE VI

| Parts Description Memory Array Element 16 Memory Board | |
|---|---|
| CMOS Hex Inverter | Miscellaneous: |
| CMOS Decoder | |
| CMOS Octal Buffer | Capacitors: .01 uF, .1 uF |
| CMOS Octal Latch | Resistors: 4K, 16.2K |
| CMOS 8 bit Comparitor | Connectors: 184 pin |
| CMOS Quad Or | |
| CMOS 32K × 8 RAM | |

An interconnection between all the individual printed circuit boards is provided by a printed circuit motherboard, a method familiar to those skilled in the art of computer electronics. Mechanical and electrical interconnect to the motherboard is provided by conventional connectors.

The power converter is a conventional dc to dc converter familiar to those skilled in the art of electronics designed for missiles and spacecraft. The components used in the preferred embodiment are described in Table VII.

TABLE VII

| Parts Description Power Supply Element 18 |
|---|
| Bipolar Pulse Width Modulator IC |
| Bipolar Voltage Reference IC |
| Bipolar Optocoupler IC |
| Bipolar Diode, Rectifier |
| Bipolar Diode, Switching |
| Bipolar Diode, Zener |
| Transistor, NPN High Current |
| Transistor, PNP High Current |
| Transistor, NPN Switching |
| Transistor, PNP Switching |
| Capacitors: Bypass 100 pf-1 uF |
| Capacitors: Filter 4.7 uF-30 uF |
| Resistors: Wire Wound 90.9-11.1K |
| Resistors: Thick Film 4.7-1M |
| Inductors: 2.3 MHz, 28 MHz |
| Transformers: Multitap secondary |

The circuit elements set forth in the tables as well as the circuits associated with such elements are known in the art and hence are not described in detail.

As the invention is used, power is provided from the vehicle to which it is attached. The power is either continously provided or switched to provide an on/off control capability for the user (or vehicle). Signal sources which are on the vehicle and require storage are connected to recorder 10 as the external signal source (see element 11, FIG. 1). A plurality of signal sources can be connected to recorder 10. As data signals are detected by the input section, element 14 of the recorder 10, they are digitized and converted to a 64 bit parallel word. This word is then encoded for error determination and an 8 bit check code is added to the 64 data bits to form a 72 bit word which is stored in the memory array element 16 at a location determined by the controller section element 12 to be useable (or error free) memory. The controller section keeps track, on a per channel basis, of where data are stored. If sufficient data are provided to fill-up all of the available memory array 16 space, then the recorder will stop taking data.

During the playback operation, data are read from the memory array 16 as 72 bit words. The controller section 12 computes the check code on the first 64 bits of each word and compares it with the last 8 bits of that word. The controller corrects any single bit errors in the 64 data bits and transfers it to the output section element 14 where it is serialized and provided as the recorder output to a signal sink element 13 which is typically another electronics box which is part of the vehicle. The recorder 10 outputs a continuous sequence of data. As the 64 bits are output, the next 72 bits are being accessed by the controller 12 and reduced to 64 data bits for the output section 14. The time phasing of this process within the recorder is such that as the last bit of a 64 bit word is transferred out to the signal sink 13, the first bit of the next word is ready to be transferred. As a result of the architecture set forth in this invention, a plurality of inputs can be multiplexed into a single output. Further, the architecture permits the vehicle to simultaneously record data from a plurality of signal sources and playback stored data through a plurality of outputs to the vehicle signal sink(s).

The operation of the recorder 10 is under the control of the vehicle via the command inputs, element 23 FIG. 1. The data systems for aircraft, spacecraft and missiles typically have electronics which are used for commanding subsystems. The recorder firmware is designed to be compatible with the vehicle's command formats. The status of the recorder is also available to the vehicle data system upon request via the telemetry output element 23 FIG. 1. The recorder 10 firmware is designed to be compatible with the vehicle's telemetry formats. The command and telemetry files within recorder 10 are embedded in the firmware and are therefore programmed at the time of manufacture to reflect specfic user requirements.

The recorder 10 invention has potential benefit in many applications where weight, power, size, temperature, vibration and moisture may shorten useful life of conventional electromechanical recording devices or may prevent the usefulness entirely.

Although the invention has been described in considerable detail with reference to a preferred embodiment, it will be understood that various modifications can be made within the spirit and scope of the appended claims.

What is claimed is:

1. A recording device for recording information comprising:
    an input/output interface circuit;
    a data storage memory connected to said input/output interface circuit for storing data, said data storage memory being partitioned into memory pages of programable size;
    a direct memory access circuit for controlling the input and output of data to and from said data storage memory;

address and data lines interconnecting said direct memory access circuit and said data storage memory;

a central processing unit connected to said direct memory access circuit;

a program memory connected to said central processing unit for storing the operational program for the recording device, said program memory having a test data pattern for memory testing of said data storage memory by cycling the test data pattern throughout the memory pages of said data storage memory to determine good memory pages under control of said central processing unit, and error detection and correction means connected to said direct memory access circuit and to said input/output circuit for detecting and correcting errors, said error detection and correction means comprising means for appending a check code word to said data and for indicating to said input/output interface circuit the error status when data are read from said data storage memory and for correcting errors when they are detected, means for determining memory pages with non-correctable errors, test means for testing said address and data lines interconnecting said direct memory access circuit and said data storage memory and means for using the test data pattern of said program memory to test the function of said error detection and correction coding means.

2. The recording device for recording information of claim 1 wherein said input/output interface circuit comprises means for simultaneously recording and playing back information.

3. The recording device for recording information of claim 2 wherein said data storage memory has multiple channels for information and further comprising means for providing memory capacity to each channel as needed.

4. The recording device for recording information of claim 3 further comprising means connected to said program memory for interpreting remote commands to establish modes of operation.

5. The recording device for recording information of claim 3 further comprising means connected to said program memory for indicating the status of said recording device.

* * * * *